United States Patent [19]
Ikeda et al.

[11] Patent Number: 5,791,484
[45] Date of Patent: Aug. 11, 1998

[54] ASSEMBLY OF CHIP PARTS

[75] Inventors: Junji Ikeda, Ikoma; Osamu Yamazaki, Toyonaka; Youichi Nakamura, Katano; Yoshifumi Kitayama, Hirakata, all of Japan

[73] Assignee: Matsushita Electric Industrial Co., Ltd., Osaku-Fu, Japan

[21] Appl. No.: 498,767

[22] Filed: Jul. 6, 1995

[30] Foreign Application Priority Data

Jul. 7, 1994 [JP] Japan ................. 6-156093

[51] Int. Cl.$^6$ ............................................. B65D 73/02
[52] U.S. Cl. ................... 206/717; 206/460; 206/813; 206/820
[58] Field of Search ..................... 206/713, 717, 206/460, 813, 714, 820

[56] References Cited

U.S. PATENT DOCUMENTS

| | | | |
|---|---|---|---|
| 3,050,186 | 8/1962 | Niles | 206/713 |
| 4,411,362 | 10/1983 | Hemadani et al. | 206/460 X |
| 4,489,487 | 12/1984 | Bura | 206/713 X |
| 4,760,916 | 8/1988 | Kaneko et al. | 206/714 |
| 4,966,281 | 10/1990 | Kawanishi et al. | 206/714 |
| 4,966,282 | 10/1990 | Kawanishi et al. | 206/714 |
| 5,158,818 | 10/1992 | Aunchio | 206/713 X |
| 5,186,328 | 2/1993 | Lenz et al. | 206/718 X |

FOREIGN PATENT DOCUMENTS

| | | | |
|---|---|---|---|
| 2833444 | 2/1979 | Germany | 206/460 |
| 3326132 | 2/1984 | Germany | 206/460 |
| 0162261 | 7/1991 | Japan | 206/330 |

*Primary Examiner*—Bryon P. Gehman
*Attorney, Agent, or Firm*—Greenblum & Berntein P.L.C.

[57] ABSTRACT

By a manufacturing method including a process of supplying a connection-releasable connecting material (4) onto a surface of a plurality of chip parts (3) and a process of connecting the plurality of chip parts (3) by the connecting material (4), there is formed a chip assembly (1) comprised of the plurality of chip parts (3) connected with each other by means of the releasable connecting material (4). Further provided is a method of preparing the chip assembly (1), a process of releasing connection achieved by the connecting material (4) between a target chip part and an adjacent chip part, and a process of mounting the target chip part separated through releasing of the connection onto a board and soldering the same, thereby providing chip parts capable of easily coping with an increase of operation speed of chip parts on the process of mounting line, achieving an improved space efficiency, and suppressing waste of resources.

10 Claims, 6 Drawing Sheets

ASSEMBLY OF CHIP PARTS

BACKGROUND OF THE INVENTION

1. Field of the Invention

The present invention relates to an assembly of chip parts such as resistors, capacitors and ICs, and also to a method of manufacturing the same and a method of mounting the same on a printed wiring board.

2. Description of the Prior Art

When chip parts are mounted onto a board such as a printed wiring board, a tape-like member is formed with an array of cavities each for receiving a chip part at a center portion thereof, and a plurality of chip parts are successively supplied from an assembly of chip parts to a wiring board. Such an assembly of chip parts is provided in a tape-type form having a plurality of chip parts mounted on a tape which is formed with feeding perforations formed on one or both side portions thereof, or an assembly of chip parts is prepared in a feeder-type form having a plurality of chip parts arranged in alignment in a feeder and the chip parts are successively supplied therefrom.

In regard of the conventional chip parts assembly in a form of a tape provided with a plurality of chip parts mounted thereon, the tape has a width much greater than the width of the chip parts due to a space for provision of the feeding perforations. Therefore, each chip part occupies a great area or volume, resulting in waste of space.

Furthermore, since the chip parts mounted on the tape tend to spring out of or fall off the tape because the tape is a disposable one, therefore an excess cost is required for manufacturing an assembly of chip parts, also resulting in waste of resources.

The chip part assembly provided by aligning a plurality of chip parts in the feeder requires a complicated work when a plurality of chip parts are set in the feeder because the chip parts are in a state of being scattered, and moreover, it can hardly cope with an increase of an operation speed in processing on a mounting line.

SUMMARY OF THE INVENTION

Accordingly, it is an essential object of the present invention to provide a chip assembly capable of easily coping with an increase of an operation speed of processing chip parts on a mounting line, assuring easy handling of the chip parts, achieving an improved space efficiency, and supplying a chip assembly while suppressing waste of resources.

Another object of the present invention is to provide a method of easily manufacturing such a chip assembly.

A further another object of the present invention is to provide a method of mounting the chip parts onto a wiring board, capable of easily coping with an increase of operation speed in processing the chip parts on a mounting line, achieving an improved space efficiency, and suppressing waste of resources.

In order to attain the objectives, a chip assembly of the present invention comprises: a plurality of chip parts; and a connecting member for releasably connecting the plurality of chip parts with each other. Each chip part having an electrode attached thereto are linked in alignment by the connecting member as placed between the chip parts. The connecting member is at least one material selected from a group consisting of a thermoplastic resin and a (e.g., conductive and/or metallic) solder.

A method of manufacturing a chip assembly of the present invention comprises the steps of:

supplying a connection-releasable connecting material onto a surface of a plurality of chip parts each having an electrode; and connecting the plurality of chip parts in alignment by melting and solidifying said connecting material, wherein the connecting material is at least one material selected from a group consisting of a thermoplastic resin and a solder. The step of supplying the connecting material comprises a step of attaching a melted of the connecting material to a surface of the plurality of chip parts, and the step of connecting the plurality of chip parts comprises: a step of linking the plurality of chip parts each having the melted connecting material attached thereto; and a step of solidifying the melted connecting material placed between the linked chip parts.

A method of manufacturing a chip assembly according to another feature of the present invention comprises the steps of:

preparing a substrate for forming chip parts having a plurality of sections with first and second division lines which perpendicularly intersect each other, each section having a chip element functioning as a chip part with an electrode attached thereto;

dividing the substrate along by said first division lines so as to form a plurality of segment arrays;

arranging said plurality of segment arrays side by side in parallel along with reference to said second division lines in alignment;

connecting said plurality of segment arrays with use of a connection-releasable connecting material; and dividing said connected plurality of segment arrays along said second division lines to thereby produce a plurality of chip assemblies. The segment array connecting step comprises: a step of linking the plurality of segment arrays by flowing the melted connecting material between the plurality of segment arrays arranged side by side; and a step of solidifying the melted connecting material.

A method of mounting chip parts on a board according to the present invention, comprises the steps of:

preparing a chip assembly produced by the manufacturing method of the present invention;

releasing connection achieved by a connecting material between a target chip part and an adjacent chip part in the chip assembly; and mounting onto the board the target chip part released from the chip assembly and then soldering the same onto the board. The connection releasing step comprises: a step of melting the connecting material connecting between the target chip part and the adjacent chip part; and a step of separating the target chip part from the adjacent chip part of the chip assembly in a state in which the connecting material is melted.

A chip assembly of the present invention comprises a plurality of chip parts and a connection-releasable connecting material that connects the plurality of chip parts. Therefore, the chip parts hardly spring out, assuring easy handling of the chip parts and allowing the chip parts to be supplied and mounted onto a board in a form of an assembly. Furthermore, the above-mentioned arrangement obviates the need of a tape having a width greater than the width of the chip parts, and dispenses with the work of setting a plurality of scattered chip parts in a feeder.

Thus, the arrangement can dispense with neither the work of putting one by one chip parts on a tape nor the work of setting a plurality of scattered chip parts in a feeder.

Accordingly, there can be easily obtained a chip assembly provided with a plurality of chip parts and a connection-releasable connecting material that connects the plurality of chip parts.

According to a method of mounting chip parts of the present invention, the chip parts hardly spring out so as to prevent the possible displacement or fall-off of the chip parts, thereby allowing the chip parts to be mounted onto the board using neither the tape nor the feeder onto which the chip parts would be mounted.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS

Figure 1:
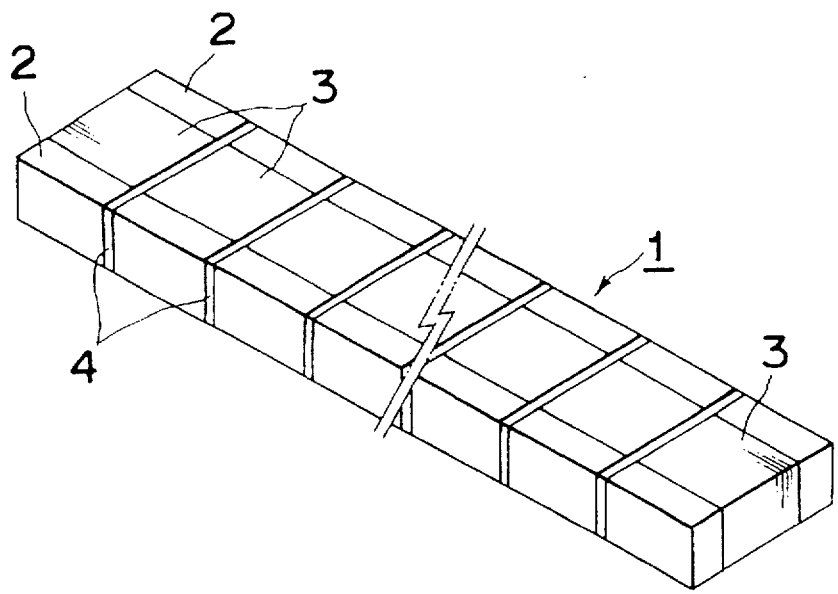
FIG. 1 is a perspective view of a chip part assembly according to a first embodiment of the present invention.

The embodiments of the present invention will be described in detail with reference to the accompanying drawings. However, the present invention is not limited to only the embodiments described hereinafter shown in the drawings. Before the description proceeds, it is noted that, since the basic structures of the embodiments are similar, like parts are designated by like reference numerals throughout the drawings.

FIG. 1 shows a schematic construction of an assembly of chip parts (referred to as "chip assembly" hereinafter) according to a first embodiment of the present invention.

As shown in FIG. 1, the chip assembly 1 comprises a plurality of chip parts 3 arranged in an array serially adjacent to each other with a space. As a chip part, a resistor element, a laminated body formed by alternately laminating electrode layers and insulating layers of a dielectric material, an IC or the like is provided in each segment of a substrate. The chip parts 3 have a pair of electrodes 2 made of nickel or alloy of phosphor and palladium attached thereto at their both sides.

The chip assembly 1 is further provided with a connecting material 4 in a space between every two adjacent chip parts 3 for connecting the plurality of chip parts 3, for example, at their electrode portions 2 to form an assembly body of the chip parts. Thus, the connecting material 4 connects every adjacent two chip parts 3 serially as placed between the every adjacent two chip parts 3. The connecting material 4 is made of at least one material selected from a group consisting of a thermoplastic resin such as a flux or the Like and a solder.

It is noted here that, although the chip parts 3 are aligned in one line in this embodiment, they are not required to be aligned in one line -and other arrangement may be adopted.

Figure 2:
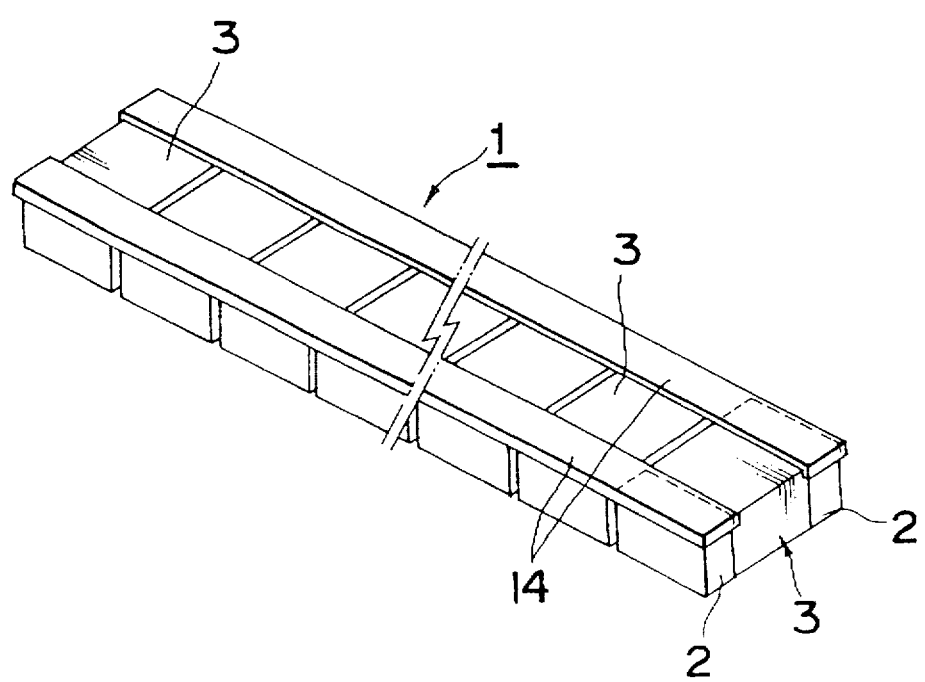
FIG. 2 is a perspective view of a chip part assembly according to a second embodiment of the present invention.

FIG. 2 shows a chip assembly according to a second embodiment of the present invention. In this embodiment, the construction thereof is similar to that of the first embodiment except for providing a tape member instead of providing a connecting material 4.

In FIG. 2, the chip assembly 1 comprises a plurality of chip parts 3 having a pair of electrodes 2 attached at their both sides thereof and a pair of tape members 14 attached thereon in parallel.

The tape members 14 are attached onto a part of the surface of the chip parts substantially covering over upper surfaces of the electrodes 2. The tape member 14 is a (e.g., conductive and/or metallic) solder-type tape of which one surface (lower surface in the figure) serves as a connecting means for connecting the plurality of chip parts 3 serially in alignment. The tape member 14 has its width slightly greater than the width of each electrode 2 of the chip parts 3 for sufficiently covering over the surface of the electrode 2. Thus, the plurality of chip parts 3 are connected with each other by means of the solder tape members 14 to form an assembly body of the chip parts as aligned in a lengthwise direction of the tape member 14.

Figure 3:
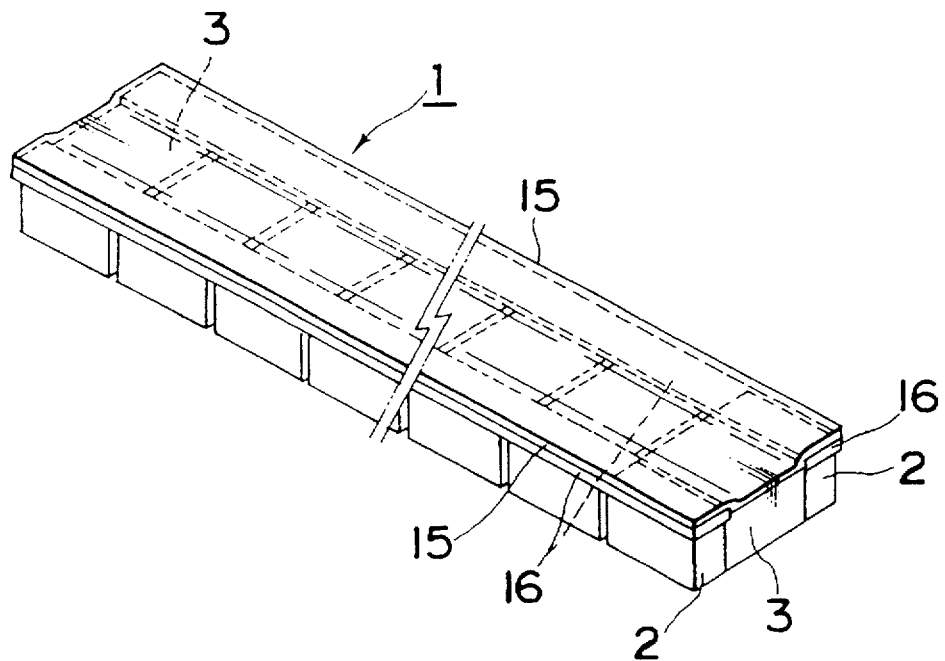
FIG. 3 is a perspective view of a chip part assembly according to a third embodiment of the present invention.

FIG. 3 shows a chip assembly according to a third embodiment of the present invention. In this embodiment, the structure thereof is similar to that of the second embodiment except for a tape member covering over the whole part of the upper surface of the chip parts 3 including the upper surface of the electrodes 2.

In FIG. 3, the chip assembly 1 comprises a plurality of chip parts 3 having a pair of electrodes 2 attached at their both sides thereof and a tape member is which serves as a connecting means for connecting the plurality of chip parts 3 as one body of a chip assembly. The tape member 15 is made of a thermoplastic resin material, e.g., a flux tape having its width slightly greater than the width of the chip parts 3 for sufficiently covering the whole upper surface thereof.

In more detail, the tape member 15 has a pair of solder members 16 coated in parallel on both side portions of the back surface (lower surface in the drawing) of the tape member 15, where each solder member 16 has its width slightly greater than the width of each electrode 2, so that the solder member 16 is arranged on the lower surface of the tape 15 substantially in positional correspondence with the electrodes 2. Namely, the pair of the solder members 16 are located on the upper surfaces of the electrodes 2 of the chip parts, 3, thereby sufficiently covering over the same.

The plurality of chip parts 3 are connected with each other as one assembly by means of the solder members 16 coated on both side portions of the surface of the tape member 15 as aligned in the lengthwise direction of the tape member 15.

The following describes the methods of manufacturing a chip assembly of a plurality of chip parts according to the present invention.

In a preferred embodiment of a manufacturing method, in the first step, prepared is a substrate for forming chip parts which is sectioned into a plurality of segments with first and second breaking division lines (or division grooves) that perpendicularly intersect each other on the surface of the chip forming substrate. The substrate is exemplified by an insulating substrate such as an alumina, semiconductor or the like substrate.

Then, a chip element of a hybrid IC having a chip part function such as a resistor, a laminated unit formed by alternately laminating electrode layers and insulating layers of a dielectric material, or the like element is formed in each of the segments.

Subsequently, an electrode is attached onto at least one surface of each segment selected from an upper surface, rear surface, end surface and side surface at both ends of each segment. Namely, an electrode is also possibly formed on the end surface and side surface of the segment in the case where the surface of the chip forming substrate is sectioned into segments along the division grooves.

In the next step, according to the method of manufacturing chip parts as mentioned above, after forming a chip element having a chip part function and an electrode in each segment, a connecting material 4 is attached to at least one surface selected from the upper surface and rear surface of each segment before dividing the segments.

In the case where the connecting material is attached only to the electrode surface, the connecting material may be attached to at least one surface selected from the upper surface, rear surface, end surface and side surface at both ends of each segment since an electrode is possibly formed on the end surface and the side surface thereof when sectioning the surface into segments along by division grooves. The connecting material is composed of a thermoplastic resin such as a flux and/or a solder. In this process, the connecting material is heated to be melted so that the resultant melt of the connecting material is attached to each electrode and then cooled to be solidified for securing the connecting material on the electrodes. The attaching process of the molten connecting material is performed by, for example, a technique of spraying, dipping or the like;

Then, the substrate having the segments formed with chip elements and electrodes attached thereto with the connecting material are divided in separation by a splitter or cutter means (not shown) along the first and second division lines or grooves, to thereby produce a plurality of chip parts each comprised of a chip element with electrodes attached onto each segment with the connecting material.

In the next step, the connecting material attached to the plurality of chip parts is melted by heating for connecting the plurality of chip parts serially to each other with the melted connecting material. Subsequently, the molten connecting material on the chip parts arranged in arrays is solidified (or congealed) by cooling for serially linking the plurality of chip parts in arrays, so that the adjoining or adjacent chip parts are serially connected with each other by means of the solidified connecting material, thereby serially linking the plurality of chip parts in arrays.

Meanwhile, regarding the melting and solidifying process of the connecting material for serially linking the chip parts in arrays, the plurality of thus formed chip parts may be first linked as aligned, and in this alignment state of the plurality of chip parts, the connecting material attached to each chip part is melted and attached to its adjacent chip part in sequence to thereby serially connect the chip parts in alignment. In this state, the connecting material is cooled to be solidified under the condition of linking the chip parts in alignment. Thus, the plurality of aligned chip parts are securely connected with one another in an integrated body in alignment by a solid of the connecting material to thereby produce a chip assembly of the plurality of chip parts in arrays.

Figure 4:
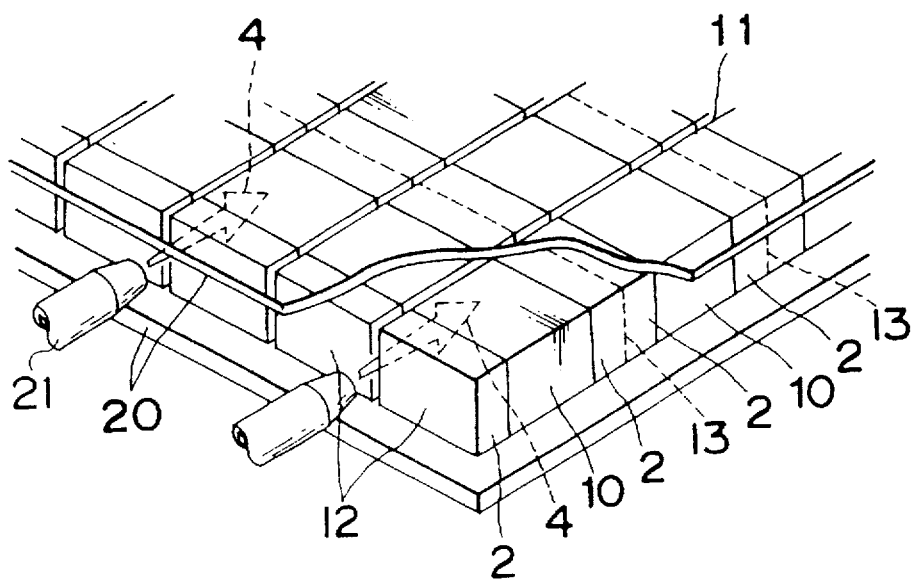
FIG. 4 is a perspective partial view showing a process of manufacturing a chip part assembly according to the first embodiment of the present invention.

In more detail, the following describes the method of manufacturing a chip assembly as shown in FIG. 1 with reference to FIG. 4.

Referring to FIG. 4, in the first step, a chip element having a chip part function together with electrodes 2 attached thereto is formed in each segment 10. Thereafter, the substrate having the resultant segments 10 formed with chip parts and electrodes are divided in separation along the first division lines or grooves 11 to produce a plurality of divided segment arrays 12. The plurality of segment arrays 12 are then arranged side by side in parallel with reference to the second division lines 13 in alignment with a space 17 between every adjacent two segment arrays 12.

Then, a flow of a melted connecting material 4 is fed into the spaces 17 between the plurality of segment arrays 12 by a technique such as spraying through a feeding nozzle 21, dipping or the like in a coating method, 60 that the connecting material 4 is attached to side surfaces of the segment arrays 12 at the spaces 17. In this case, the process of attaching the melted connecting material to a surface of the plurality of chip elements may comprise a process of coating the plurality of chip parts with the melted connecting material. Then, the melted connecting material 4 is cooled to be solidified.

In this manufacturing method, in order to prevent the molten connecting material 4 from flowing out of the spaces 17 between the segment arrays 12 during or after filling the connecting material 4 in the spaces 17, there may be provided upper and lower templates 20 so that an integrated of the plurality of segment arrays 12 may be held or interposed between the upper and lower templates 20. In this case, an inner surface of the templates 20 facing to the segment arrays is subjected to, for example, a mold releasing process so that the connecting material 4 on the segments hardly connects with the template surface.

After subjecting to the cooling process of the connecting material for solidification, the plurality of segment arrays 12 connected with each other as one body by the solidified connecting material 4 are divided in separation along the second division lines 13, thereby to produce chip assemblies 1 each having the plurality of chip parts 3 linked to each other in alignment with the solid connecting material 4.

Thus, by dividing the segment arrays 12 along the second division lines 13, each segment 10 becomes a chip part 3 as shown in FIG. 1. In this process, when the segment arrays 12 are held between the templates 20, firstly the templates 20 are removed before the segment arrays 12 are divided along the second division lines 13.

Figure 5:
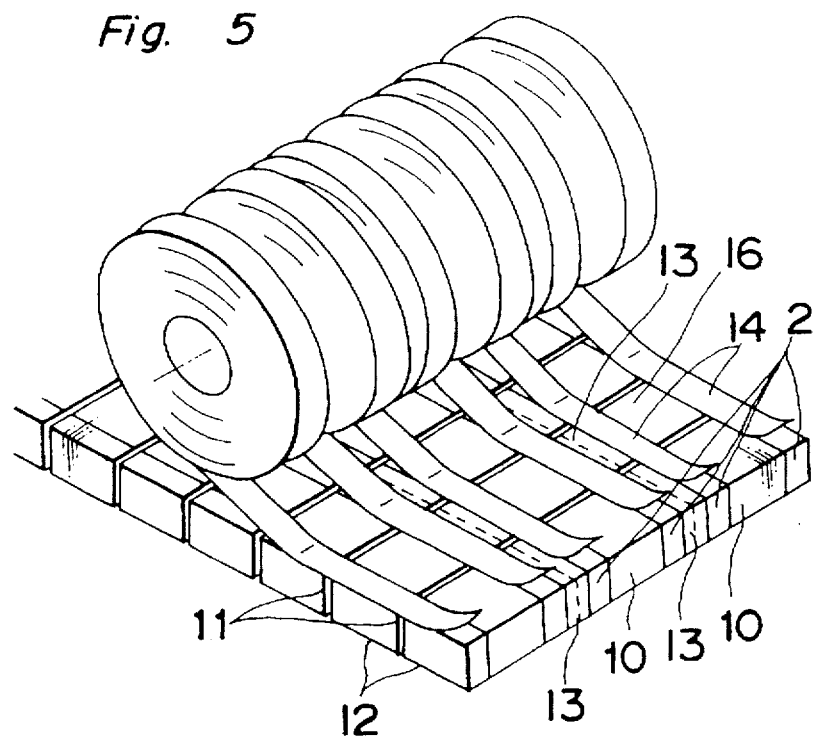
FIG. 5 is a perspective partial view showing a process of manufacturing a chip part assembly according to the second embodiment of the present invention.

The following describes another method of manufacturing a chip assembly as shown in FIG. 2 with reference to FIG. 5.

Referring to FIG. 5, in a method of manufacturing a chip assembly, initially, a chip element having a chip part function together with electrodes 2 attached thereto is formed in each segment 10 of a substrate, and thereafter the substrate having the resultant segments 10 are divided in separation along the first division lines or grooves 11, which the processes are similar to those of FIG. 4.

Subsequently, the plurality of divided segment arrays 12 are arranged side by side in alignment with reference to the second division lines 13.

Then, prepared are a plurality of solder tapes 14 in parallel each having a width slightly greater than the width of each electrode 2, which are placed on the segment arrays 12 in the direction traversing the plurality of segment arrays 12, so that each tape 14 covers over the upper surface of each electrode array 2. Thereafter, the solder tapes 14 are melted by heating to attach to the upper surfaces of the electrodes 2 and then cooled to be solidified.

Upon subjecting to the cooling process for solidification of the tapes 14, the plurality of segment arrays 12 are serially connected with each other by the solder tapes 14.

In the next step, the integrally connected segment arrays are divided in separation along the second division lines 13, thereby to produce chip assemblies 1 each having the plurality of chip parts 3 linked with each other by the solder tapes 14. Thus, by dividing the segment arrays 12 along the second division lines 13, each segment 10 becomes a chip part 3 as shown in FIG. 2.

Figure 6:
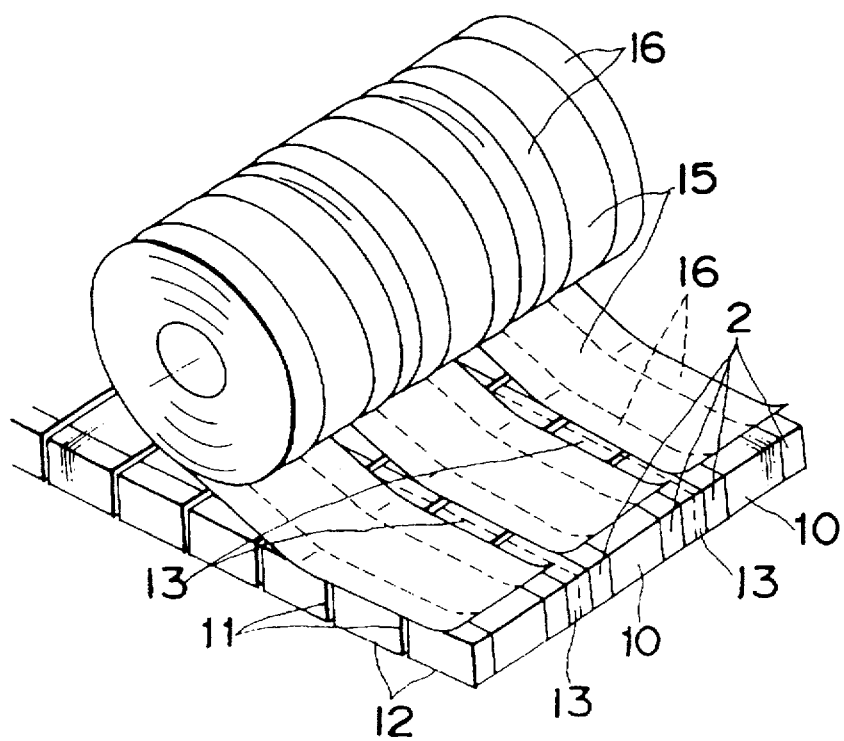
FIG. 6 is a perspective partial view showing a process of manufacturing a chip part assembly according to the third embodiment of the present invention.

The following describes further another example of a method of manufacturing a chip assembly as shown in FIG. 3 with reference to FIG. 6.

Referring to. FIG. 6, in place of the solder tapes 14 of FIG. 5, there can be used a thermoplastic resin tape 15 which has a width approximately equal to the width of the chip parts 3. Each thermoplastic resin tape 15 is provided with a pair solder belt zones 16 coated on both end portions of one surface thereof facing to the upper surface of the electrodes 2. The width of the coated solder belt 16 is slightly greater than the width of the electrode 2 for covering over the upper surface of the electrodes 2.

Since the subsequent processes for manufacturing a chip assembly are similar to those of the method shown in FIG. 5, the explanation thereof is omitted here.

Figure 7:
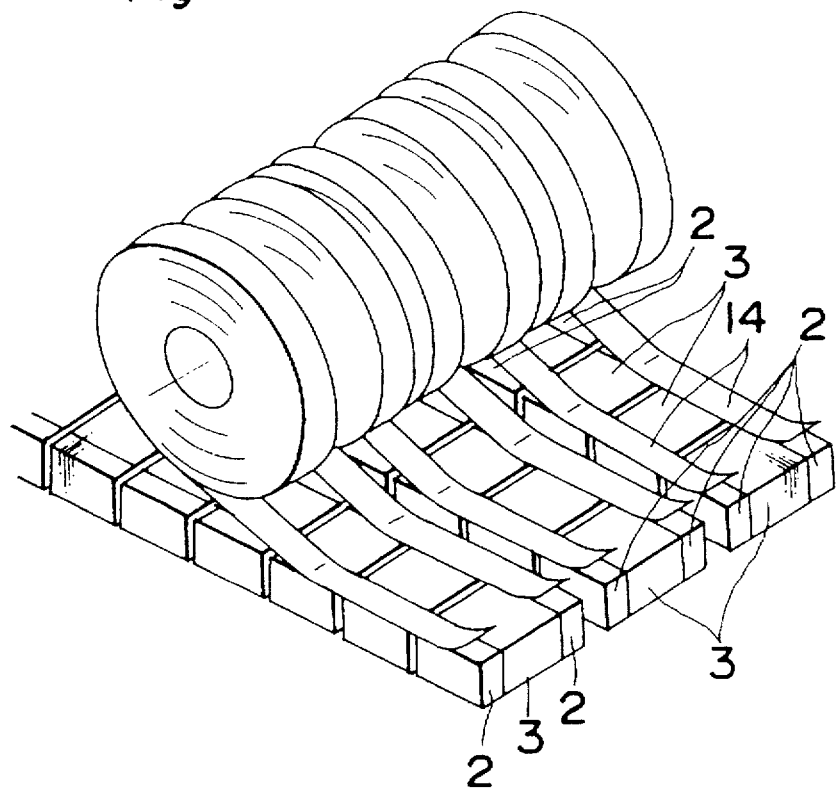
FIG. 7 is a perspective partial view showing a process of manufacturing a chip part assembly according to a fourth embodiment of the present invention.

FIG. 7 shows further another example of a method of manufacturing a chip assembly, which is similar to that of FIG. 5 except for providing no second division line 13.

As shown in FIG. 7, a plurality of chip parts 3 are arranged in arrays with their longitudinal and lateral ends aligned. Then, solder tapes 14 each having a width slightly greater than the width of an electrode 2 are put on the chip parts arrays 3 in the direction traversing the plurality of chip parts 3, covering over the upper surface of the electrodes 2. Then the solder tapes 14 are melted to attach to the electrodes of the chip parts 3 and cooled to be solidified, thereby to produce chip assemblies 1 each having the plurality of chip parts 3 serially connected to each other with the solidified solder tapes 14.

Figure 8:
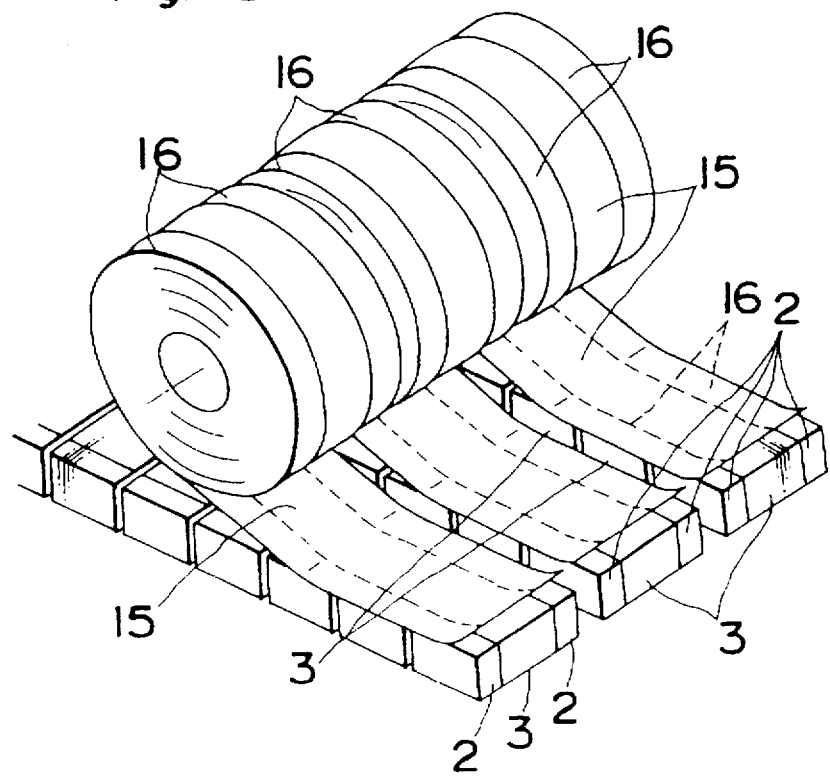
FIG. 8 is a perspective partial view showing a process of manufacturing a chip part assembly according to a fifth embodiment of the present invention.

FIG. 8 show further another example of a method of manufacturing a chip assembly, which is similar to that of FIG. 6 except for providing no second division line 13.

As shown in FIG. 8, used is a thermoplastic resin tape 15 which has a width approximately equal to the width of the chip part 3. Each thermoplastic resin tape 15 is provided with solder belt zones 16 coated on one surface thereof facing to the upper surface of the electrodes 2. The coated solder belt 16 has its width slightly greater than the width of the electrode 2, for covering over the upper surface of the electrode 2.

Since the subsequent processes for manufacturing a chip assembly are similar to those of the method shown in FIG. 6, the explanation thereof is omitted here.

As described above, in the manufacturing methods of the embodiments according to the present invention, it is noted here that, when other type of chip parts such as capacitors, ICs or the like are assembled into a chip assembly in stead of using the chip resistors, these chip parts can be also assembled in the same manner as in the case of assembling the chip resistors.

Figure 9:
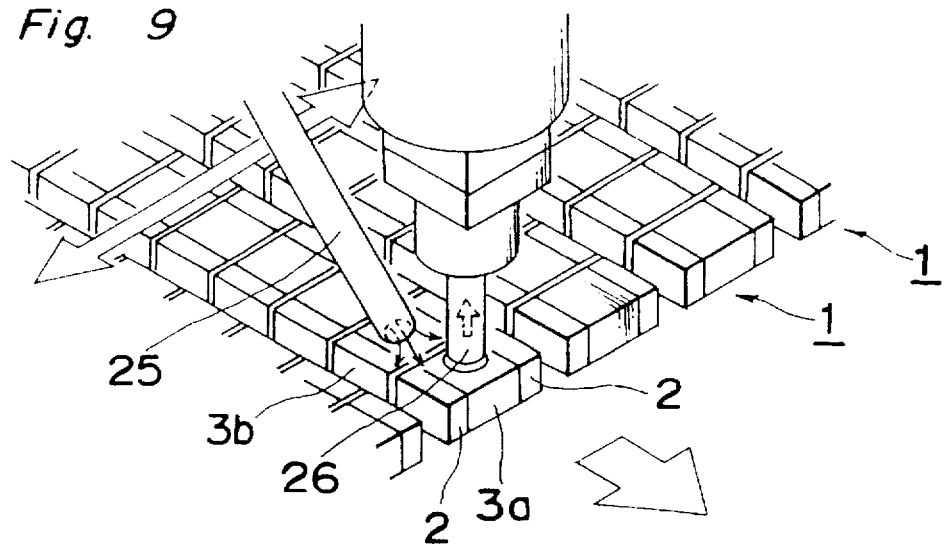
FIG. 9 is a perspective partial view showing a process of mounting chip parts according to the present invention.
Figure 10:
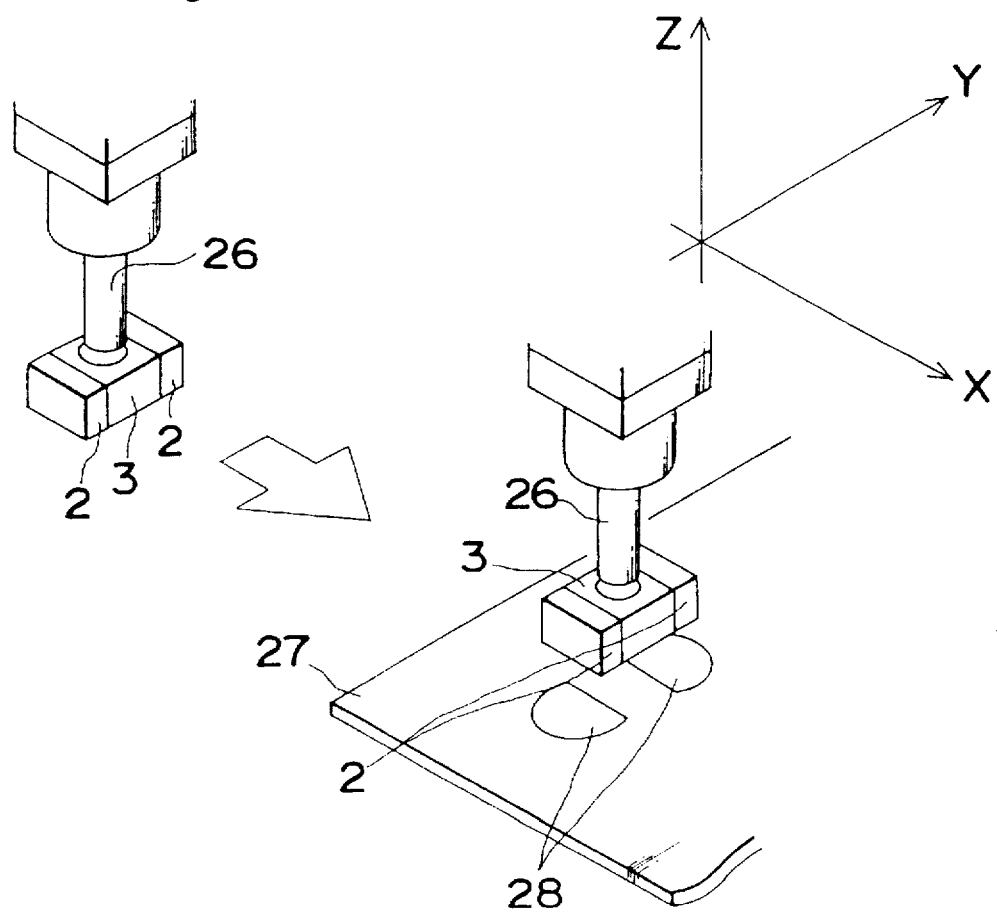
FIG. 10 is a perspective partial view showing another process of mounting chip parts according to the present invention.
Figure 11:
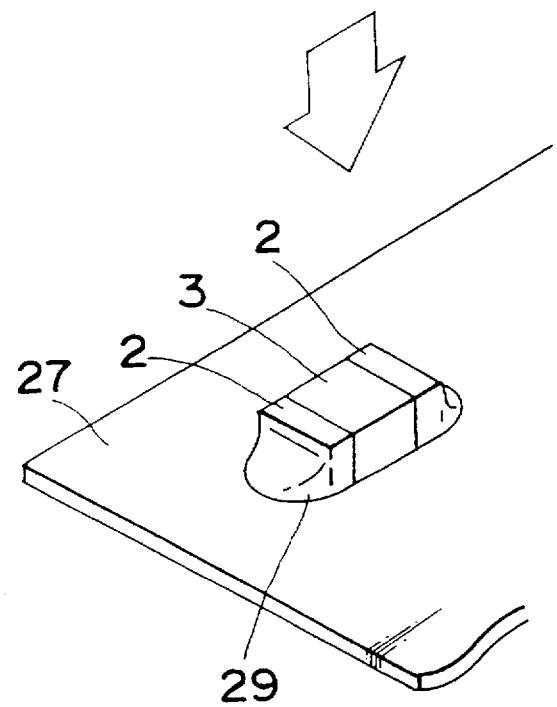
FIG. 11 is a perspective partial view showing a chip part mounted on a board.

The following describes a method of mounting chip parts onto a printed wiring board in a manner of using a chip assembly of the present invention with reference to FIGS. 9 through 11.

As shown in FIG. 9, in this embodiment, chip parts 3 are supplied in the form of a chip assembly 1 as shown in FIG. 1. When an objective chip part 3a is desired to be supplied to a board, a hot blast is blown from a hot blast nozzle 25 to a connecting material 4 attached to the desired chip part of the chip assembly 1, so that the connecting material 4 is heated to be melted.

For example, in the case where a connecting material 4 filled in the space between a foremost chip part 3a and a subsequently adjacent chip part 3b is heated to be melted with the hot blast fed from the hot blast nozzle 25, the foremost chip part 3a is attracted by suction to an air suction nozzle 26 in the upward direction, and then the suction nozzle 26 having the foremost chip part 3a attracted thereto is moved to a target location on the board 27. With the movement of the suction nozzle 26, the chip part 3 attracted by suction to the suction nozzle 26 can be moved apart from the chip assembly 1.

As shown in FIG. 10, the suction nozzle 26 attracting the released chip part 3 is positioned by properly moving or pivoting the nozzle in X-Y directions, and then moved in a Z-direction so as to mount the chip part in a specified position on the board 27.

Then the chip part 3 mounted on the board 27 is soldered using a solder 29 to an electric circuit 28 formed on the surface of the board 27.

It is to be noted here that, when a flux is used as the connecting material 4, the flux attached to the chip part 3 melts in this soldering stage on the board to activate the solder 29. Meanwhile, when a solder is used as the connecting material 4, the solder per se attached to the chip part 3 is melted in the soldering stage to be used for soldering.

After the foremost chip part 3a is separated from the chip assembly 1, the adjacent chip part 3b becomes a new foremost chip part of the chip assembly 1, and then the new foremost chip part is mounted onto the board 27 in the same manner as in the case of the chip part 3a.

When a hindmost chip part (not shown) of the chip assembly 1 is supplied in the same manner as in the case of the foremost chip part 3a, new chip parts are sequentially supplied from a new chip assembly in the same manner as described above.

In the meantime, in the case where chip parts are supplied in the form of the chip assembly 1, a releasing means such as a hot blast nozzle (25) for releasing the connection achieved by the connecting material and a moving means such as an air suction nozzle (26) for moving the chip parts released from the connection of the connecting material are operated simultaneously or approximately simultaneously, thereby releasing the chip part or parts one by one or in the order of a desired amount. The released chip parts are guided and mounted onto the board through positioning.

The above-mentioned operation can be easily carried out with an increased operation speed in comparison to the conventional case where chip parts are taken out of a feeder, and therefore the operation can cope with an increase of an operation speed during the process on a mounting line.

Moreover, by setting numbers of chip assemblies 1 in an apparatus for mounting chip parts and successively feeding the assemblies 1, chip parts can be successively supplied even when the mounting line has an increased operation speed.

In this embodiment, the connection by the connecting material between the objective chip part and the adjacent chip part in the chip assembly is previously released by melting before the chip parts are supplied to be mounted onto a board in the form of a chip assembly of the present invention.

In the case where a thermoplastic resin or solder is used as the connecting material, the connecting material can be melted by heating or a similar technique to allow the objective chip part and the adjacent chip part to be separated from each other in the molten state of the connecting material. Heating can be performed by, for example, blowing a hot blast on the connecting material. By means of a hot blast, the melted connecting material is easily blown off to be removed.

Thus, in the present invention using a thermoplastic resin, preferably a flux, or solder as the connecting material, the cooled solid of the connecting material between the objective chip part and the adjacent chip part in the chip assembly is melted by blowing a hot blast on the connecting material, so that the connection of the connecting material can be released. In the stage of supplying each chip part in the form of the chip assembly of the present invention onto a board, the mounting of the chip parts is performed by, for example, a combination of securing by means of adhesive and electrical connection of the chip part onto the board, a combination of securing by means of solder and electrical connection of the chip part onto the board, or in a similar manner.

A chip assembly of the present invention comprises a plurality of chip parts and a connection-releasable connecting material that releasably connects the plurality of chip parts. Therefore, the chip parts hardly spring out to allow the achievement of supplying chip parts with an increased operation speed during the process on the mounting line.

By this arrangement, easy handling of chip parts is assured, achieving an improved space efficiency, and suppressing waste of resources. Moreover, by supplying chip parts in the form of the chip assembly of the present invention and mounting the chip parts onto a board, the need of a tape for mounting the chip parts is obviated, dispensing the work of setting a plurality of scattered chip parts in a feeder.

Therefore, the present invention can achieve an increased space efficiency, suppression of waste of resources, and simplifying the work of mounting chip parts, also easily coping with an increase of operation speed of the mounting line.

According to the manufacturing method of the present invention, a chip assembly of a plurality of chip parts can be easily manufactured.

According to the mounting method of the present invention, the operation speed of the chip parts on the mounting line can be easily increased, while achieving an improved space efficiency and suppressing waste of resources.

It is noted that the chip parts used in the present invention are chip-shaped electronic or electric parts such as resistors, capacitors, and ICs. A plurality of chip parts are preferably aligned in a line or in a plurality of lines taking into account the fact of facilitating mounting of the chip parts onto a board and assuring easy handling of the assembly.

There is no specific limitation on the connecting material used in the present invention so long as it can release connection. As the connecting material, there is used one which can be melted and solidified as selected from a group consisting of thermoplastic resin (including natural resin having a thermoplasticity) and solder. When the thermoplastic resin and/or solder is melted, a plurality of chip parts can be connected to one another or disconnected from one another. When the connecting material connecting chip parts is melted so as to separate adjacent chip parts, or the connecting material is melted and removed, the connection between the chip parts is released. Each chip part released through the disconnecting process is mounted onto a board.

The mounting of each chip part onto a board is performed by, for example, a combination of securement by means of an adhesive and electrical connection of the chip part onto the board, or a combination of securement by means of solder and electrical connection of the chip part onto the board.

When the connecting material used in the present invention is one which can be melted and solidified (e.g., a thermoplastic resin or solder), disconnection and connection can be easily performed by heating and cooling. For the thermoplastic resin, it is preferable to use a flux such as pine resin, activated rosin and activated synthetic resin.

The board onto which each chip part is to be mounted is a board such as a printed wiring board formed with electrodes to be connected with the electrodes of chip parts.

The connecting material is preferably implemented by a flux and/or solder. The flux has an effect of activating solder when each chip part is soldered to a board. Therefore, the flux is not required to be discarded after releasing connection, and moreover it operates as adhesive, consequently providing a convenience in connecting the chip parts with one another in an integrated body. The solder can be used in soldering chip parts onto a board, and therefore the solder is not required to be discarded after releasing connection.

What is claimed is:

1. A chip assembly comprising:
    a plurality of chip parts, each having an electrode attached thereto; and
    a connecting member for releasably connecting adjacent ones of said plurality of chip parts, said adjacent ones of chip parts being linked in alignment by said connecting member positioned between said adjacent ones of said chip parts, and
    wherein said connecting member is formed from a connecting material for connecting said chip parts to a printed wiring board, said connecting material being selected from the group consisting of: a flux resin that is thermoplastic, and a conductive solder.

2. The chip assembly as claimed in claim 1, wherein said connecting member is a solder tape having a width slightly greater than a width of each electrode of the chip parts, and said plurality of chip parts are linked in alignment by connecting the electrodes with one surface of said solder tape, said plurality of chip parts being aligned in a lengthwise direction of said solder tape.

3. The chip assembly as claimed in claim 1, wherein said connecting member is a solder which is coated on both end portions of one surface of a thermoplastic resin tape in a width slightly greater than a width of each electrode of said chip parts, said thermoplastic resin tape having a width slightly greater than a width of said chip parts, and wherein the electrodes of said chip parts are connected with each other by said solder as aligned in a lengthwise direction of said tape.

4. A chip assembly comprising:

a plurality of chip parts, each chip part having electrodes attached thereto; and a metallic solder tape for soldering said chip parts to a printed wiring board, said metallic solder tape extending between said plurality of chip parts for releasably connecting each one of said plurality of chip parts with an adjacent one of said plurality of chip parts, said plurality of chip parts being linked in alignment in a lengthwise direction of said metallic solder tape by connecting electrodes of adjacent chip parts with one surface of said metallic solder tape, said solder tape having a width slightly greater than a width of each electrode of the chip parts.

5. A chip assembly comprising:

a plurality of chip parts, each having electrodes attached thereto; and a resin tape for releasably connecting each one of said plurality of chip parts with an adjacent one of said plurality of chip parts, said resin tape being thermoplastic and having a width slightly wider than a width of said chip parts, said resin tape having solder for soldering said chip parts to a printed wiring board coated on both lateral sides of one surface in a width slightly greater than a width of said electrodes, and said electrodes of adjacent chip parts being connected with each other by said solder in a lengthwise direction of said resin tape, said plurality of chip parts being thereby linked in alignment by said solder positioned between said electrodes of adjacent chip parts.

6. A chip assembly for use by a device that places chip parts on a printed wiring board, said chip assembly comprising:

a plurality of chip parts, each having at least two electrodes formed thereon; and a connecting member extending between electrodes of adjacent ones of said plurality of chip parts and joined to said electrodes, said connecting member being formed from at least one meltable material suitable for connecting a chip part to a printed wiring substrate and capable of participating in a soldering process, each chip part being separable, together with a portion of said connecting member, from said connecting member, and said separable chip part and said portion of said connecting member being capable of placement together on a printed wiring substrate.

7. The chip assembly according to claim 6, wherein said connecting member is wholly formed from one meltable material suitable for connecting a chip part to a printed wiring substrate and capable of participating in a soldering process selected from the group consisting of: meltable flux resin, and solder.

8. The chip assembly according to claim 6, wherein said connecting member is wholly formed from a composite of meltable resin and solder.

9. The chip assembly according to claim 6, wherein said each of said plurality of chip parts may be separated, together with said portion of said connecting member, from said connecting member by melting said connecting member between electrodes of adjacent ones of said plurality of chip parts.

10. A chip assembly for use by a device that places chip parts on a printed wiring board, said chip assembly comprising:

a plurality of chip parts, each having an electrode attached thereto; and a connecting member for releasably connecting adjacent ones of said plurality of chip parts, said adjacent ones of chip parts being linked in alignment by said connecting member positioned between said adjacent ones of said chip parts, and wherein said connecting member is formed from a connecting material for connecting said chip parts to a printed wiring board, said connecting material being a metallic solder.

* * * * *